United States Patent [19]

Garritano

[11] Patent Number: 5,397,987
[45] Date of Patent: Mar. 14, 1995

[54] METHOD AND APPARATUS FOR ANALYZING SAMPLES USING NUCLEAR MAGNETIC RESONANCE

[75] Inventor: Ronald F. Garritano, Flemington, N.J.

[73] Assignee: Rheometrics, Inc., Piscataway, N.J.

[21] Appl. No.: 25,586

[22] Filed: Mar. 3, 1993

[51] Int. Cl.[6] .............................................. G01V 3/00
[52] U.S. Cl. ..................................... 324/307; 324/315
[58] Field of Search ............... 324/300, 307, 309, 315, 324/316, 318, 322, 321

[56] References Cited

U.S. PATENT DOCUMENTS

| | | | |
|---|---|---|---|
| 3,987,361 | 10/1976 | Martin, Jr. et al. | 324/315 |
| 4,719,582 | 1/1988 | Ishida et al. | 364/498 |
| 4,820,983 | 4/1989 | Bendall et al. | 324/307 |
| 4,832,037 | 5/1989 | Granot | 128/653 |
| 4,853,635 | 8/1989 | Cuppen | 324/309 |
| 4,910,460 | 3/1990 | Sebok | 324/307 |
| 5,015,954 | 5/1991 | Dechene et al. | 324/307 |
| 5,049,819 | 9/1991 | Dechene et al. | 324/307 |
| 5,302,896 | 4/1994 | Dechene et al. | 324/307 |
| 5,302,897 | 4/1994 | Tache et al. | 324/307 |

OTHER PUBLICATIONS

J. G. Powles and J. H. Strange, Zero Time Resolution Nuclear Magnetic Resonance Transients in Solids, Proceedings of The Physics Society, vol. 82, 1963 month unknown.
B. C. Gerstein, C. Chow, R. G. Pembleton, and R. C. Wilson, Utility Pulse Nuclear Magnetic Resonance in Studying Protons in Coals, Ames Laborstory, 1976 month unknown.
T. T. P. Cheung and B. C. Gerstein, [1]H Nuclear Magnetic Resonance Studies of Domain Structures in Polymers, Ames Laboratory, 1981 month unknown.
Eiichi Fukushima and Stephen B. W. Roeder, Experimental Pulse NMR A Nuts and Bolts Approach, Addison-Wesley Publishing Company, 1981 nonth unknown.
H. W. Spiess, Molecular Dynamics of Solid Polymers As Revealed by Deuteron NMR, Colloid & Polymer Science, 1983 month unknown.
R. M. Pearson and T. L. Parker, The Ue of Small Nuclear Magnetic Resonance Spectromethers as On-Line Analyzers for Rotary Kiln Control, Light Metals, 1984 month unknown.

(List continued on next page.)

*Primary Examiner*—Louis Arana
*Attorney, Agent, or Firm*—Samuelson & Jacob

[57] ABSTRACT

A magnetic resonance analyzing apparatus includes a sampling region; a first temperature stabilization assembly for maintaining the sampling region at a predetermined temperature; a magnet for applying a base magnetic field to the sampling region; a coil for applying a first 0° phase excitation pulse to the sampling region at a first time, and a second 90° phase offset excitation pulse to the sampling region at a second time corresponding substantially to an end of a first time period during which an output signal emitted from the sample as a result of the first excitation pulse can not be detected; a detector for detecting the output signal in response to the excitation pulses; a computer for forming a free induction decay (FID) curve from the output signal, starting from a third time corresponding substantially to an end of a second time period during which an output signal emitted from the sample as a result of the second excitation pulse can not be detected, separating the FID curve into a Gaussian (crystallinity) curve, exponential (amorphous) curve, and intermediate (combination of crystallinity and amorphous) curve, and determining a characteristic of the sample in correspondence with y-axis intercepts of at least one of the Gaussian, exponential, intermediate and FID curves; and a second temperature stabilization assembly for controlling the temperature of the sample at the predetermined temperature prior to entering the sampling region.

30 Claims, 7 Drawing Sheets

OTHER PUBLICATIONS

R. M. Pearson, L. Ryhti and C. Job, Automatic On-Line Measurement of Moisture Content and Surface Area of Aluminum Oxide, Light Metals, 1986 month unknown.

Robert M. Pearson, L. Rika Ream, Constantin Job and John Adams, The Use of Small Nuclear Magnetic Resonance Spectrometers for On-Line Process Control, Cereal Foods World, 1987 month unknown.

Vladimir D. Fedotov and Horst Schneider, Structure and Dynamics of Bulk Polymers by NMR Methods, Springer-Verlag, 1989 month unknown.

Jon S. Kauffman and Cecil Dybowski, Determination of Transition Temperatures and Crystalline Content of Linear, High-Molecular-Weight Polyethylene by Proton NMR Spectroscopy, Journal of Polymer Science: Polymer Physics, 1989 month unknown.

Hiroshi Tanaka, Fumie Kohrogi and Kazuhiko Suzuki, Temperature Dependence of Proton Spin-Lattice and Spin-Spin Relaxation Times in Isotactic Polypropylene, Effect of Annealing, Eur. Polym. J., 1989 month unknown.

D. Waddington, Applications of Wide-Line Nuclear Magnetic Resonance in the Oils and Fats Industry, Unilever Research month unknown.

METHOD AND APPARATUS FOR ANALYZING SAMPLES USING NUCLEAR MAGNETIC RESONANCE

The present invention relates generally to nuclear magnetic resonance (NMR), and particularly, is directed to a method and apparatus for more accurately analyzing characteristics of samples by means of nuclear magnetic resonance.

Pulsed magnetic resonance analysis operates on the principle that each nucleus of protons and neutrons in certain elements has a net spin. If the number of nuclear particles is even, their spins will cancel each other, leaving zero net spin. However, if there is an odd number of nuclear particles, a net spin other than zero will be produced. Because each nucleus is positively charged, it generates a small magnetic field when it spins. However, the magnetic moments produced by such spinning charged particles are randomly oriented.

When a base magnetic field is applied, the spinning nuclei tend toward alignment with the applied field, that is, become "parallel" with the field. However, many of the nuclei do not reach perfect alignment with the field, but rather, are tilted at an angle to the field, thus behaving like tops or gyroscopes spinning under the force of gravity. In other words, the nuclei rotate or precess in a conical manner about an axis in line with the applied base magnetic field. In addition, the nuclei spin about their own axes. Thus, the nuclei have a component perpendicular to the base magnetic field, known as the transverse component. The phase of this transverse component will tend to be random. Thus, in the absence of external forces, the nuclei will tend to precess out of phase with each other.

However, the spinning nuclei eventually tend toward lining up in the direction of the applied base magnetic field, because this is at a lower energy state. In order for magnetic resonance analysis to operate, the nuclei must be coherently tipped down away from such alignment toward the transverse plane, and this is accomplished by adding an RF pulse signal having a frequency which is the same as the natural precessional frequency of rotation of the rotating nuclei. Specifically, the RF pulse signal creates a field which rotates synchronously with the precessing spins. Accordingly, the nuclei move into a higher energy state in coherence at the resonant frequency, and thereby absorb energy. In this manner, transverse magnetization precesses around the axis of the external field such that the nuclei are all in phase. When the RF pulse signal is removed, the nuclei will return to the lower energy state which is in line with the magnetic field. During the initial part of this return, the nuclei will go out of phase and the phases of the nuclei will be random. This will show up as a signal on the pick-up coil. The signal that is measured will be the vector sum of the signal from all the individual nuclei.

An apparatus that operates on the above principles can be used in differentiating between physical phases in samples and quantifying variations in constituents of samples. For example, various characteristics, such as density, tacticity, xylene or decalin solubles and the like in polyethylene and polypropylene and other polymers, can be determined. One such apparatus is disclosed in U.S. Pat. Nos. 5,015,954 and 5,049,819, the entire disclosures of which are incorporated herein by reference. The advantage of such a system is that there is rapid analysis without destruction of the sample and without requiring any sample preparation, such as extraction with hazardous solvents.

With U.S. Pat. No. 5,015,954, a sample of the material to be tested is captured by a probe and is fed through an inlet line to a sample region of the apparatus. The sample region is surrounded by a magnetic assembly that produces the aforementioned base magnetic field. A coil in surrounding relation to the sample region is used to apply an RF pulse signal and to pick up an output AM signal returned from the sample after the pulse signal is removed. Specifically, the excitation of the coil and the excitation-precession of the sample's proton content and subsequent relation/decay produces the received AM signal. The AM signal is demodulated, amplified and converted to digital form, whereupon the signal is plotted as a free induction decay (FID) curve.

U.S. Pat. No. 5,049,819 is similar to U.S. Pat. No. 5,015,954, with the exception that further pulses are supplied to provide Hahn spin echo responses.

These patents recognize that the FID curve is made up of a Gaussian curve corresponding to the crystalline (solid-like) content of the sample, and an exponential (Lorentzian) curve corresponding to the amorphous (liquid-like) content of the sample. The Gaussian curve predominantly occupies the beginning of the FID curve, while the exponential curve predominantly occupies the end of the FID curve.

Further, it is recognized in the patents that detection of the AM signal does not occur until a small time after the pulse signal is removed. This is due to the inductance of the coil, since it takes time for remnants of the excitation pulse to die down, which occur in a time period $\tau$ which extends from the pulse signal at a time origin $t_0$ to a subsequent time $t_1$. However, for determining the characteristics of the sample, it is imperative to determine the y-axis intercepts of the Gaussian and exponential curve at the time origin $t_0$. Therefore, the apparatus of these patents perform an extrapolation process. Specifically, the exponential curve in a time period at the end of the FID curve, is extrapolated back to a time origin, that is, until the exponential curve intersects the y-axis at time origin $t_0$, by fitting the closest exponential curve to the end of the FID curve. Then, the Gaussian curve is obtained by subtracting the beginning of the FID curve with the beginning of the fitted exponential curve, and the resultant Gaussian curve is extrapolated back to the time origin $t_0$ with a least squares analysis, until the Gaussian curve intersects the y-axis at time origin $t_0$. This is accomplished by fitting the closest Gaussian curve to the beginning of the FID curve. The time origin $t_0$ is at the theoretical center of the pulse signal.

From the values of the y-intercepts of the Gaussian and exponential curves at the time origin $t_0$, various characteristics of the samples can be obtained. Specifically, this is accomplished by determining the ratio of the value of either the Gaussian or exponential curve over the sum of the values of both the Gaussian and exponential curves, and then determining the particular characteristic from a graph of known characteristic values versus known ratio values.

One disadvantage of such a system is that an extrapolation process must be used by the aforementioned curve fitting procedures, based upon only part of the FID curve. This is not entirely accurate. For example, for the exponential curve, only an end period of the FID curve is used to provide a closest fit to a known exponential curve, and this curve is then extended rearwardly in time to find the y-intercept at time origin $t_0$. Therefore, since the entire FID curve is not used, only a rough approximation is obtained.

It is known to find the y-intercept of the FID curve in a more precise manner. Specifically, as taught by J. G. Powles and J. H. Strange, "Zero Time Resolution Nuclear Magnetic Resonance Transients in Solids," Proc. Phys. Soc., Vol 82, pages 6–15, 1963, and by Eiichi Fukushima and Stephen B. W. Roeder, Experimental Pulse NMR, A Nuts and Bolts Approach", pages 251–256, Addison-Wesley Publishing Co., Inc., Reading, Mass., 1981, after the application of the first RF pulse, a second RF pulse which is 90° out of phase with the first RF pulse, is applied at time $t_1$, that is, after time period $\tau$. As a result, there is a tendency for the decay after the second pulse to show a maximum at a time $t_2$ which occurs after a time period $2\tau$ from the time origin. This is known as a solid echo. It has been shown that the value of the signal at time $t_2$ is effectively the same as the value of the signal at the time origin $t_0$, and that the curve from time $t_2$ forward is the same as the curve that would have been produced from a single pulse at the time origin $t_0$, but shifted to the right by the time period $2\tau$. For example, Powles and Strange have shown the equivalence of such curves for polypropylene at 24° C.

Further, it has also theoretically been determined that the FID curve is actually a combination of three distinct curves, namely a crystalline (Gaussian) curve, an amorphous (exponential) curve and an intermediate curve. See Vladimir D. Fedotov and Horst Schneider, NMR 21, Structure and Dynamics of Bulk Polymers by NMR-Methods, pages 51–61, Springer-Verlag, Berlin, Germany, 1989, and Hiroshi Tanaka et al., "Temperature Dependence of Proton Spin-Lattice and Spin-Spin Relaxation Times in Isotactic Polypropylene-Effect of Annealing," Eur. Polym. J., Vol. 25, No. 5, pages 449–453, 1989. Therefore, the utilization of only two component curves, that is the use of only the Gaussian or crystalline curve and the exponential or amorphous curve, as taught in the aforementioned U.S. Pat. Nos. 5,015,954 and 5,049,819, produces still further errors. It is emphasized that the translation of the FID curve into three curves has only been theoretically provided, and has never been used for practical applications.

Also, known magnetic resonance analyzing apparatus only use the ratio of the y-intercept of the crystalline curve over the y-intercept of the FID curve to determine xylene solubles. However, this is inaccurate since the intermediate curve includes a crystalline component.

In addition, the aforementioned U.S. Pat. Nos. 5,015,954 and 5,049,819 utilize a temperature stabilization system for stabilizing the temperature of the sampling region of the NMR apparatus. This has a tendency to bring the temperature of the sample to a desired temperature for analysis. However, because of differences in the particle size distribution of the sample, the temperature may not be the same throughout the sample when initially placed in the NMR device. As a result, the FID curve that is obtained will vary depending upon the temperature of the sample when the sample is input into the sampling tube of the NMR apparatus. Thus, even with the temperature stabilization system in the sampling region, there will still be inaccuracies in the resulting FID curve, depending upon the temperature of the sample when the sample is input into the NMR apparatus.

The present invention provides a method and apparatus for analyzing samples using nuclear magnetic resonance which avoids many of the problems encountered in the above-outlined devices, and exhibits several objects and advantages, some of which may be summarized as follows. First, the combination of using two pulses 90° out of phase to attain zero time resolution, separating the FID curve into three distinct curves using curve fitting techniques, and then using the y-intercept values for all three curves, produces much greater accuracy in determination of the characteristics of the sample being tested. Second, the present invention actually uses the intermediate curve, along with the crystalline curve, to determine the amount of xylene solubles. Third, by ensuring that the sample, prior to entering the NMR device is at the same temperature as that maintained by the temperature stabilization system in the sampling region, there is greater accuracy in determination of the characteristics of the sample being tested.

The above objects and advantages, as well as further objects and advantages, are attained by the present invention which may be described briefly as a magnetic resonance analyzing apparatus including a sampling region which holds a sample; base field applying means for applying a base magnetic field to the sampling region to effect precession of nuclei of the sample; pulse applying means for applying a first excitation pulse having a first phase to the sampling region at a first time, to modify the precession, and applying a second excitation pulse having a second phase offset from the first phase by 90°, to the sampling region at a subsequent second time corresponding substantially to an end of a first time period during which an output signal emitted from the sample as a result of the first excitation pulse can not be detected, in order to further modify the precession; detecting means for detecting the output signal emitted from the sample as a result of the first and second excitation pulses; and analyzing means for (a) forming a free induction decay (FID) curve from the output signal, starting from a subsequent third time corresponding substantially to an end of a second time period during which an output signal emitted from the sample as a result of the second excitation pulse can not be detected, (b) separating the FID curve into a Gaussian curve corresponding substantially only to crystallinity content of the sample, an exponential curve corresponding substantially only to amorphous content of the sample, and an intermediate curve corresponding to a combination of the crystallinity and amorphous contents of the sample, and (c) determining a characteristic of the sample in correspondence with y-axis intercepts of at least one of the Gaussian curve, the exponential curve and the FID curve.

Specifically, the analyzing means determines the characteristic by determining a ratio of the y-axis intercept of the Gaussian curve to the y-axis intercept of the FID curve.

The FID curve is defined by the following equation containing first through fourth terms:

$$y = a_0 + a_1 e^{-(\frac{x}{\tau_1 + k})^2} + a_2 e^{-(\frac{x}{\tau_2 + k})} + a_3 e^{-(\frac{x}{\tau_3 + k})^2}$$

wherein the first term is a constant, the second term represents the Gaussian curve corresponding substantially only to crystallinity content of the sample, the third term represents the exponential curve corresponding substantially only to amorphous content of the sample, and the fourth term represents the intermediate curve corresponding to a combination of the crystallinity and amorphous contents of the sample, and wherein k, $a_0$, $a_1$, $a_2$, $a_3$, $\tau_1$, $\tau_2$ and $\tau_3$ are constants.

The detector means includes amplifier means for amplifying the output signal and envelope detecting means for detecting and separating an envelope signal of the output signal, and the analyzing means includes a central processing unit. The pulse applying means is formed by a sampling coil surrounding the sampling region, and transmitter means for supplying a modulated oscillation signal to the sampling coil; and the base field applying means includes a permanent magnet surrounding the sampling region.

Further, in accordance with the present invention, a method for analyzing a sample using magnetic resonance, includes the steps of holding the sample in a sampling region; applying a base magnetic field to the sampling region to effect precession of nuclei of the sample; applying a first excitation pulse having a first phase to the sampling region at a first time, to modify the precession; applying a second excitation pulse having a second phase offset from the first phase by 90°, to the sampling region at a subsequent second time corresponding substantially to an end of a first time period during which an output signal emitted from the sample as a result of the first excitation pulse can not be detected, in order to further modify the precession; detecting the output signal emitted from the sample as a result of the first and second excitation pulses; forming a free induction decay curve from the output signal, starting from a subsequent third time corresponding substantially to an end of a second time period during which an output signal emitted from the sample as a result of the second excitation pulse can not be detected; separating the free induction decay curve into a Gaussian curve corresponding substantially only to crystallinity content of the sample, an exponential curve corresponding substantially only to amorphous content of the sample, and an intermediate curve corresponding to a combination of the crystallinity and amorphous contents of the sample; and determining a characteristic of the sample in correspondence with y-axis intercepts of at least one of the Gaussian curve, the exponential curve, the intermediate curve and the free induction decay curve.

In accordance with another aspect of the invention, a magnetic resonance analyzing apparatus includes a sampling region which holds a sample; first temperature stabilization means for maintaining the sampling region at a predetermined temperature; base field applying means for applying a base magnetic field to the sampling region to effect precession of nuclei of the sample; pulse applying means for applying at least one excitation pulse to the sampling region to modify the precession; means for detecting and analyzing a signal emitted from the sample as a result of the at least one excitation pulse; and second temperature stabilization means for controlling the temperature of the sample to the predetermined temperature prior to the sample entering the sampling region.

The second temperature stabilization means includes sample conditioning means, external of the sampling region, for holding a sample to be tested by the magnetic resonance analyzing apparatus, and temperature control means for maintaining the sample conditioning means at the predetermined temperature.

The temperature control means preferably includes a jacket in surrounding relation to the sample conditioning means, means for circulating a liquid through the jacket at a set temperature in order to maintain the sample at the predetermined temperature in the sample conditioning means, and temperature adjustment means for controlling the temperature of the liquid. In addition, the temperature control means preferably also includes means for circulating a gas through the sample in the sample conditioning means at a set temperature in order to rapidly change and to maintain the sample at the predetermined temperature in the sample conditioning means, and temperature adjustment means for controlling the temperature of the gas.

In addition, the second temperature stabilization means includes a temperature stabilized block maintained at the predetermined temperature, and valve means for metering out the sample from the sample conditioning means to the temperature stabilized block.

Further, in accordance with the present invention, a method for analyzing a sample using magnetic resonance, includes the steps of holding the sample in a sampling region; maintaining the sampling region at a predetermined temperature; applying a base magnetic field to the sampling region to effect precession of nuclei of the sample; applying at least one excitation pulse to the sampling region to modify the precession; detecting and analyzing a signal emitted from the sample as a result of the at least one excitation pulse; and controlling the temperature of the sample to the predetermined temperature prior to the sample entering the sampling region.

The invention will be understood more fully, while still further objects and advantages will become apparent, in the following detailed description of a preferred embodiment of the invention illustrated in the accompanying drawing, in which:

Figure 1:
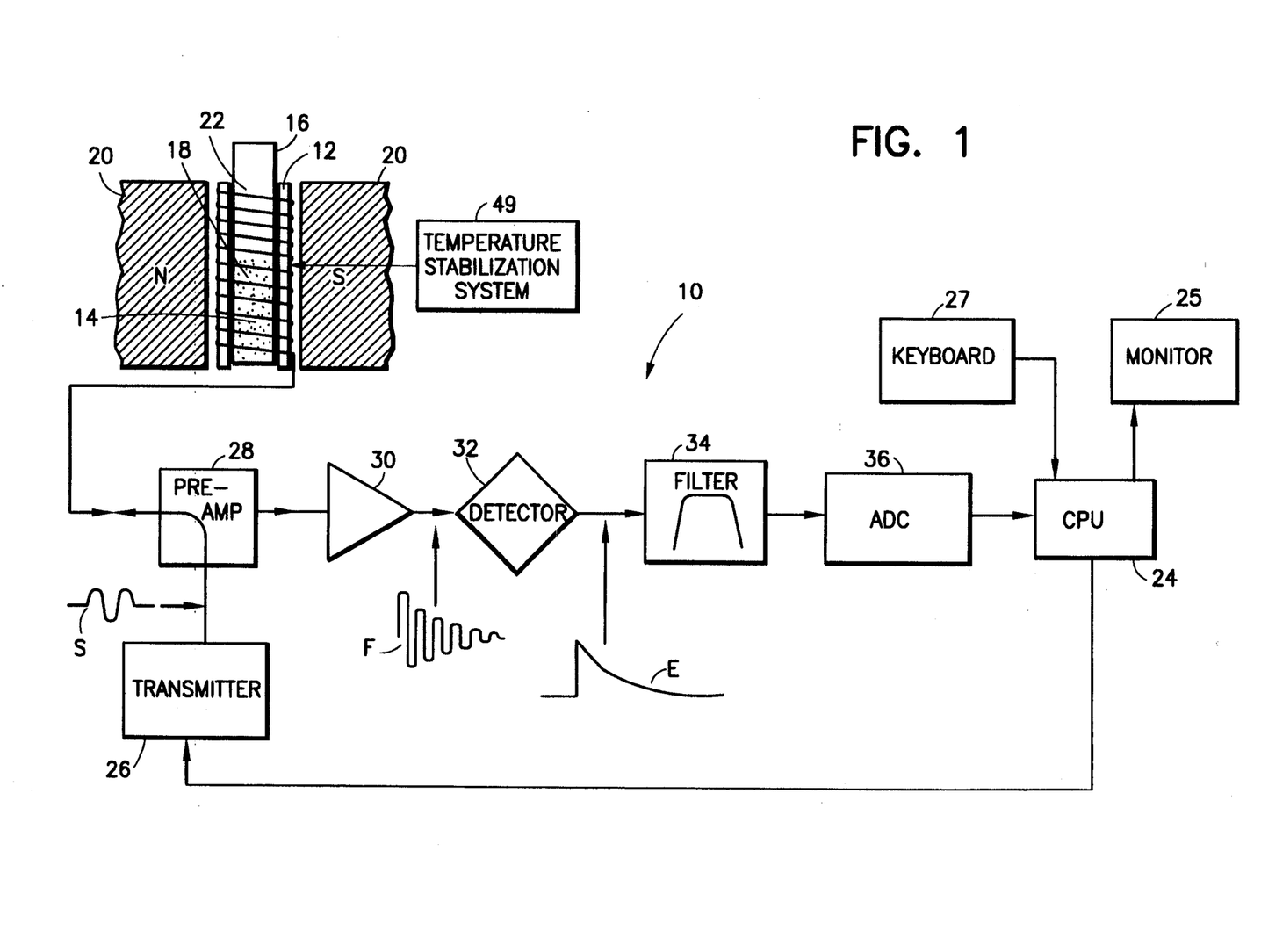
FIG. 1 is a block, schematic diagram of an apparatus for analyzing samples using nuclear magnetic resonance in accordance with the present invention.

Referring now to the drawing, and initially to FIG. 1, an apparatus for analyzing samples using nuclear magnetic resonance and constructed in accordance with the present invention is illustrated generally at 10. Apparatus 10 includes a sampling sleeve 12 for holding a sample 14 to be tested. Sampling sleeve 12 is made from an essentially non-magnetic, non-conducting material which does not produce any interfering signals. For example, the present invention may utilize the NMR apparatus sold by Oxford under the designation "QP20 Pulsed NMR Spectrometer." In such case, the sample to be tested is held in a glass test tube 16 which is positioned within sampling sleeve 12. When glass test tube 16 is placed within apparatus 10, sample 14 is held within a sampling region 18 of sampling sleeve 12.

Apparatus 10 includes a permanent magnet 20 in surrounding relation to sampling sleeve 12 in order to generate a static or base magnetic field that is required for polarization of the nuclei. Magnet 20 has its field directed transverse to the axis of sampling sleeve 12. Although an iron-core permanent magnet 20 is shown, it will be appreciated that other magnets, such as electrically excited air-core resistive magnets and the like, can be used, depending upon the desired bore size of sampling sleeve 12, the desired strength and uniformity of the magnetic field, and the like.

In addition, adjustable Helmholtz coils and the like (not shown), as taught by the aforementioned U.S. Pat. No. 5,015,954, may be used to adjust the static or base magnetic field.

In order to apply the required RF pulse signal, an RF coil 22 is provided in surrounding relation to sampling sleeve 12 and within the bore of magnet 20. RF coil 22 generates the RF pulses necessary for the excitation of the magnetization, that is, for inducing transverse magnetization. In such case, RF coil 22 functions as a transmitter of RF signals. The need for precise timing for the RF pulses requires that this process be under computer control. Accordingly, as shown in FIG. 1, a central processing unit (CPU) 24 controls RF coil 22 through a transmitter 26 which produces a highly stable RF signal and a pre-amplifier 28 which amplifies the RF signal to a level suitable for pulsed excitation. In addition, a monitor 25 and keyboard 27 are connected with CPU 24, as is conventional.

CPU 24 outputs a square pulse which is modulated by a sinusoidal oscillation signal S from a crystal oscillator (not shown) of a transmitter 26, the sinusoidal oscillation signal S preferably having a frequency of 20 MHz, at zero degrees (0°) phase.

RF coil 22 is operated in a dual capacity. Specifically, due the excitation-precession of the sample's proton content and subsequent relaxation/decay, RF coil 22 produces an AM signal, and thereby, RF coil 22 also functions as a pick-up device. In this regard, small microvolt signals induced in RF coil 22 are supplied to pre-amplifier 28 and then to a receiver 30, both of which amplify the microvolt signal to a signal in the range of approximately 5–10 volts, to produce an amplified AM signal F. This amplified signal is then supplied to a detector 32 which obtains the envelope signal E of the 20 MHz amplified signal. This envelope signal is then supplied to a filter 34 which removes noise in order to increase the signal-to-noise (S/N) ratio. Thereafter, the filtered envelope signal is converted to digital form by an analog-to-digital converter (ADC) 36 and then supplied to CPU 24 for processing.

Figure 2:
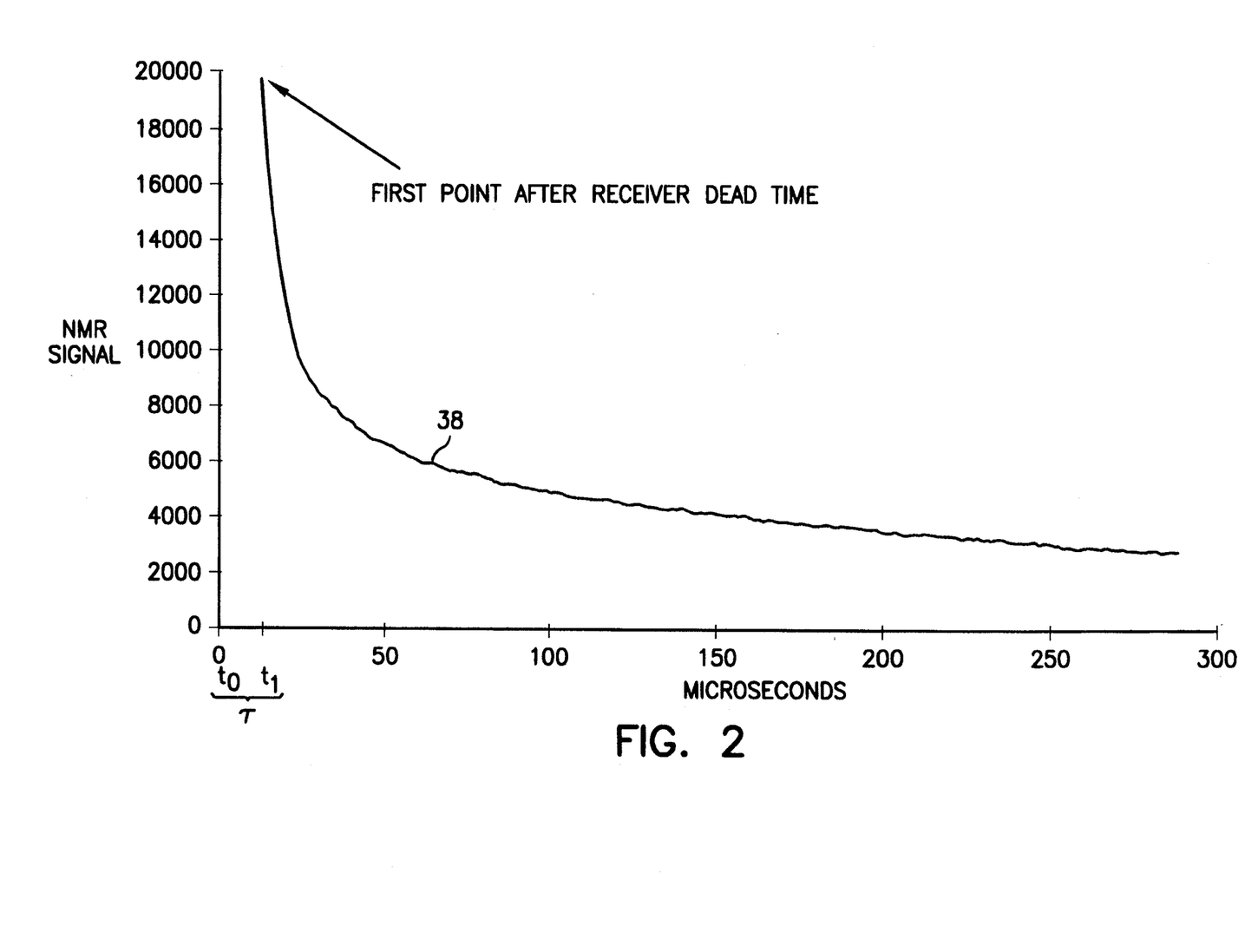
FIG. 2 is a graph of a free induction decay (FID) curve, showing the processed NMR signal received from the pick-up coil versus time.

CPU 24 produces a free induction decay (FID) curve 38, as shown in FIG. 2, which is a graph of the processed NMR signal received from coil 22 versus time in microseconds. The particular plot of FIG. 2 is the result of a single 90° pulse at zero phase, being produced by RF coil 22. As discussed above, U.S. Pat. No. 5,015,954 recognizes that detection of the AM signal does not occur until a small time after the RF pulse signal is removed. This is because there are saturation effects of the electronics of the apparatus, which occur in a time period $\tau$ which extends from the pulse signal at the time origin $t_0$ to a subsequent time $t_1$. However, for determining the characteristics of the sample, it is imperative to determine the y-axis intercept at the time origin $t_0$. Therefore, the apparatus of this patent performs an extrapolation process.

One disadvantage of such a system is that an extrapolation process must be used by the aforementioned curve fitting procedures, based upon only part of the FID curve. This is not entirely accurate. Since the entire FID curve is not used, only a rough approximation is obtained.

Figure 3:
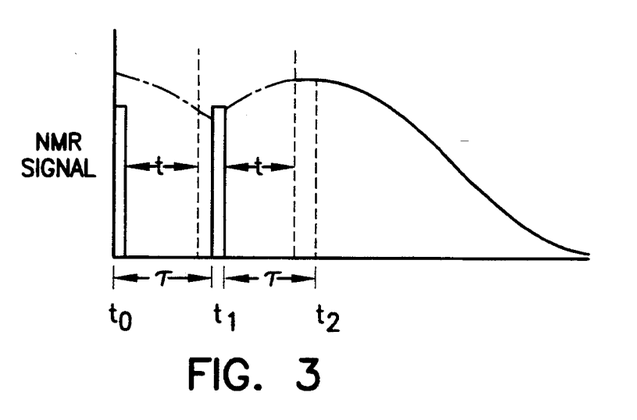
FIG. 3 is a graph showing the results of application of a first RF pulse which is followed by a second RF pulse that is 90° out of phase with the first RF pulse.

As discussed above, it is known to find the y-intercept of the FID curve in a more precise manner. Specifically, as shown in FIG. 3, after the application of the first RF pulse, a second RF pulse which is 90° out of phase with the first RF pulse, is applied at time $t_1$, that is, after time period $\tau$. This can be represented as a 90°, $\tau$, 90°$_{90°}$ sequence. As a result, there is a tendency for the decay after the second pulse to show a maximum at a time $t_2$ which occurs after a time period $2\tau$ from the time origin. This is known as a solid echo. It has been shown that the value of the signal at time $t_2$ is effectively the same as the value of the signal at the time origin $t_0$, and that the curve from time $t_2$ forward is the same as the curve that would have been produced from a single pulse at the time origin $t_0$, but shifted to the right by the time period $2\tau$.

Figure 4:
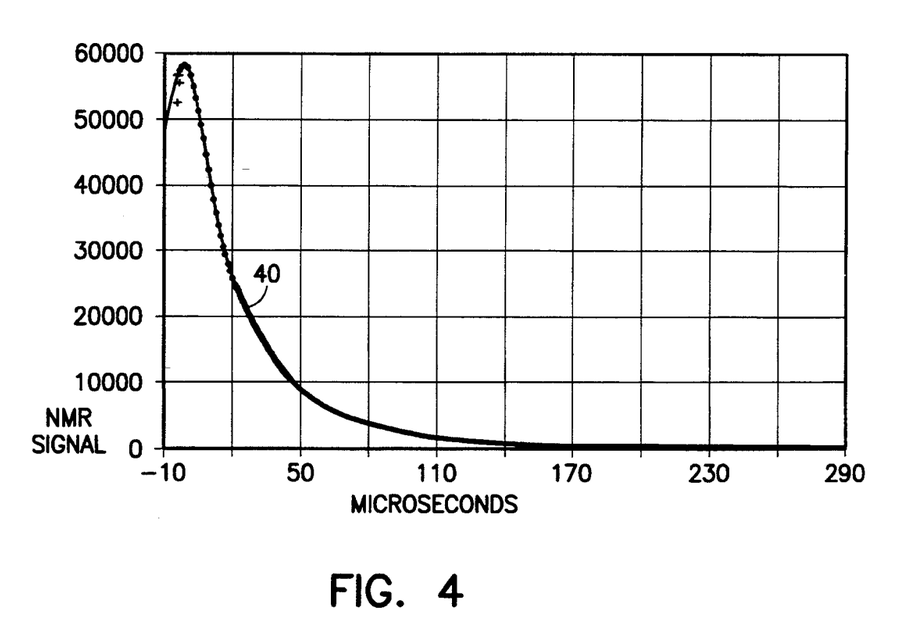
FIG. 4 is a graph of a free induction decay (FID) curve, showing the processed NMR signal received from the pick-up coil versus time, after the application of a first RF pulse which is followed by a second RF pulse that is 90° out of phase with the first RF pulse.

Therefore, in accordance with the present invention, rather than utilizing the inaccurate extrapolation technique of U.S. Patent No. 5,015,954, CPU 24 controls transmitter 26 such that a first RF pulse signal having zero degree phase is produced by RF coil 22, followed by a second RF pulse signal having a 90° phase. As a result, an FID curve 40 as shown in FIG. 4 is produced which shows the level of the NMR signal of the FID curve at the y-intercept at time origin $t_0$. Of course, the curve must be shifted back by the time period $2\tau$. As a result, a true FID curve 40 is obtained without the need to provide any extrapolation, as in U.S. Pat. No. 5,015,954.

Further, as discussed above, it has, in theory, been determined that the FID curve is actually a combination of three distinct curves, namely a crystalline (Gaussian) curve, an amorphous (exponential) curve and an intermediate curve. Therefore, the utilization of only two component curves, that is the use of only the Gaussian or crystalline curve and the exponential or amorphous curve, as taught in the aforementioned U.S. Pat. Nos. 5,015,954 and 5,049,819, produces still further errors.

Figure 5:
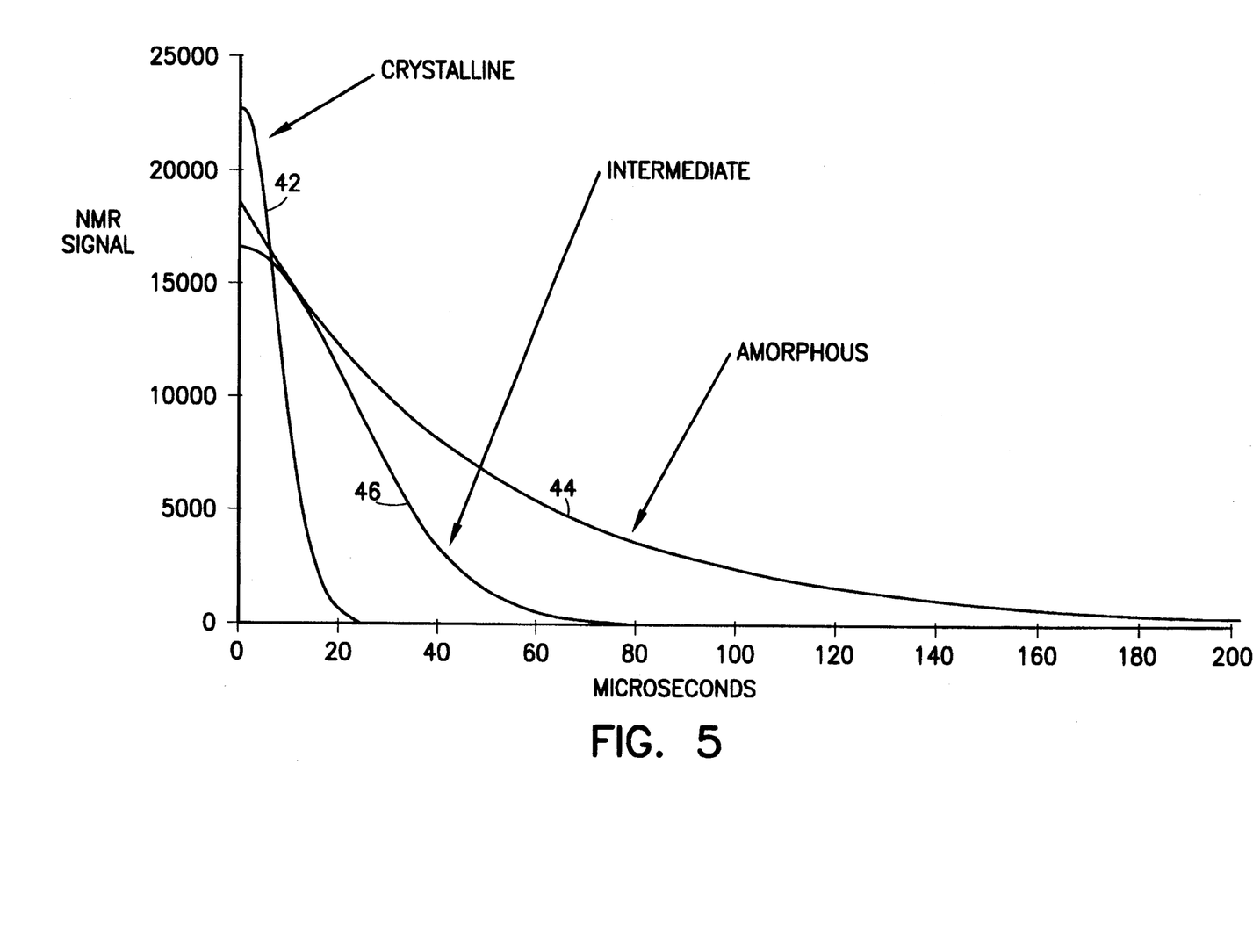
FIG. 5 is a graph showing the FID curve broken down into a crystalline (Gaussian) curve, amorphous (exponential) curve and intermediate curve.

In accordance therewith, the present invention breaks down the FID curve 40 into three distinct curves, namely, a crystalline (Gaussian) curve 42, amorphous (exponential) curve 44 and intermediate curve 46, as shown in FIG. 5. The three curves are derived from the general equation:

$$y = a_0 + a_1 e^{-(\frac{x}{\tau_1 + k})^2} + a_2 e^{-(\frac{x}{\tau_2 + k})} + a_3 e^{-(\frac{x}{\tau_3 + k})^2}$$

wherein the first term is a constant, the second term represents the crystalline (Gaussian) curve 42, the third term represents the amorphous (exponential) curve 44 and the last term represents the intermediate curve. It is noted that the last term is constructed as a Gaussian curve, although the last term could also be represented by an exponential curve. However, for the best fit, a Gaussian curve for the last term is preferred.

In such case, the constants k, $a_0$, $a_1$, $a_2$, $a_3$, $\tau_1$, $\tau_2$ and $\tau_3$ are determined to provide the best fit for all three curves for the respective Gaussian and exponential curve fits and so that the sum of all of the curves produces the FID curve 40.

In this regard, any suitable curve fitting software can be used, such as the curve fitting software sold by Jandel Scientific of San Rafael, Calif. under the trademark "TABLE CURVE". Such software is well known and uses a least means squares fit. With such software, and with the particular curves of FIGS. 4 and 5, it was found that the goodness of the curve fit for the three curves was 99.99749%, using the test of $r^2$ coefficient of determination, and that the goodness of the curve fit for the three curves was 99.99742%, using the test of the coefficient of determination that has been adjusted for degrees of freedom. The latter test represents a true least squares sort criteria.

In order to utilize the above data to determine various characteristics, for example, the density, tacticity, xylene insolubles and the like of a polymer such as polyethylene and polypropylene, it is necessary to determine the ratio of the y-intercept of just the crystalline curve 42, the amorphous curve 44, or the intermediate curve 46, at time $t_0$ to the y-intercept of the FID curve 40 at time $t_0$. In such case, curves have already been produced (or can easily be produced) which correlate known values of the characteristic for different ratios. One such curve 48 is shown in FIG. 6 for the density of a polymer.

In this regard, it is noted that known devices have only used the ratio of the y-intercept of crystalline curve 42 to the y-intercept of the FID curve 40 to determine the amount of xylene solubles. However, the determination of the amount of xylene solubles is a function of crystallinity. The present invention obtains a determination of the amount of xylene solubles with much greater precision by using the ratio of the sum of the y-intercepts of the crystalline curve 42 and the intermediate curve 46 to the y-intercept of the FID curve 40.

Figure 6:
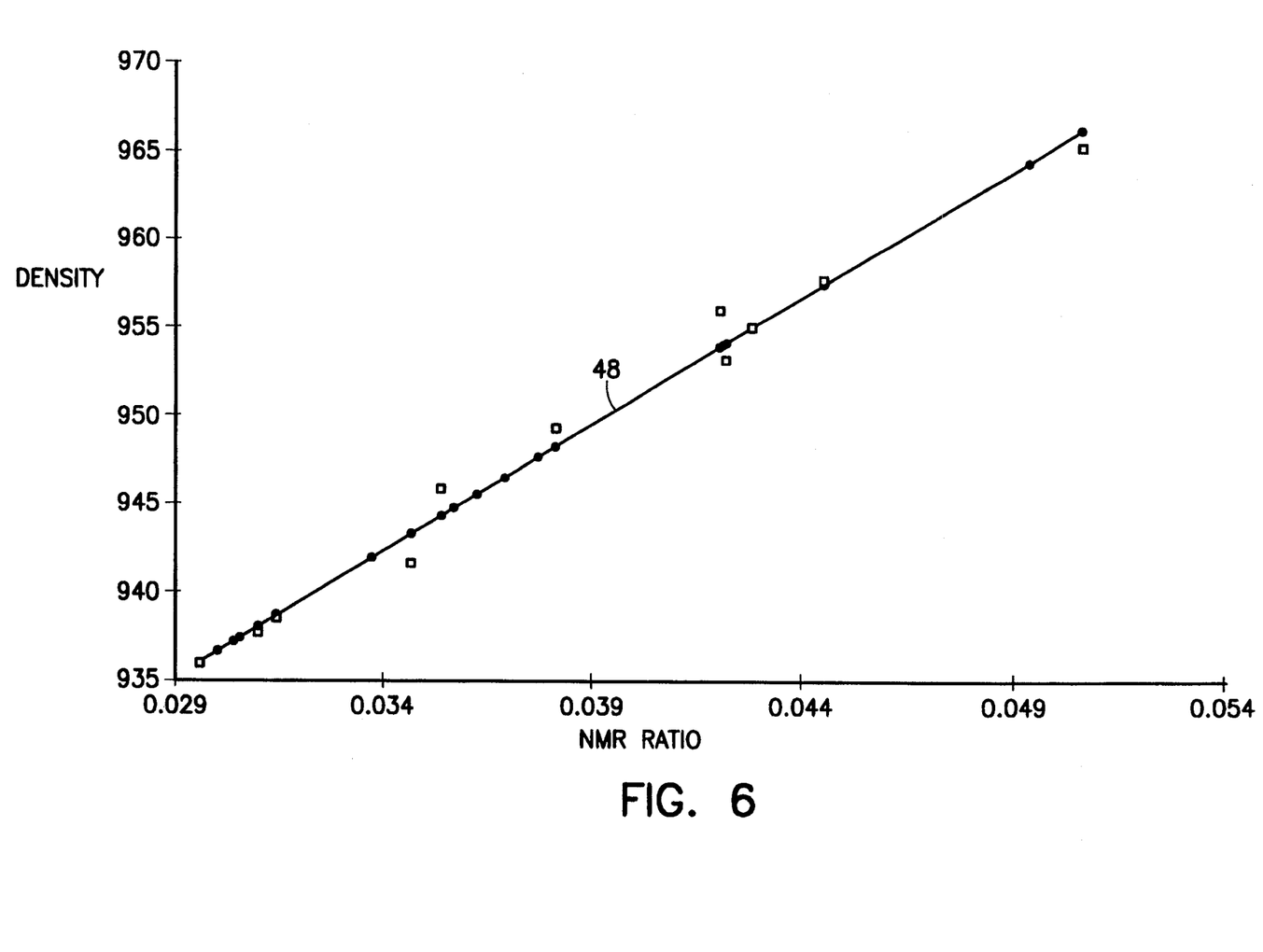
FIG. 6 is a graph showing the density characteristic of a sample versus the NMR ratio, for known correlation values.

Therefore, once the FID curve 40 is broken down into the crystalline, amorphous and intermediate curves, it is only necessary to determine the y-intercepts and the ratio, and then determine the density from the graph of FIG. 6.

It will be appreciated that, because of the combination of (a) the two RF pulses which are 90° phase offset from each other and (b) the separation of the FID curve 40 into three distinct curves 42, 44 and 46, there is much greater accuracy in the determination of the particular characteristic of the sample.

Specifically, the use of two RF pulses which are 90° phase offset from each other results in an accurate FID curve, without the need for extrapolation. Thus, when obtaining the crystalline, amorphous and intermediate curves, a more accurate determination of the y-intercepts for these curves can be obtained.

In addition, each of the crystalline, amorphous and intermediate curves 42, 44 and 46 is obtained from the entire FID curve 40, thereby utilizing all of the data points of the FID curve 40, rather than extrapolating from a small portion of the FID curve as is done in U.S. Pat. No. 5,015,954.

Still further, by utilizing three curves 42, 44 and 46, a more accurate representation is obtained. It will be appreciated that, when separating the FID curve only into the crystalline and amorphous curves of U.S. Pat. No. 5,015,954, some portions of the intermediate curve are found in both the crystalline and amorphous curves. As a result, the y-intercepts will be incorrect, and erroneous readings of the sample characteristics will be obtained.

Figure 7:
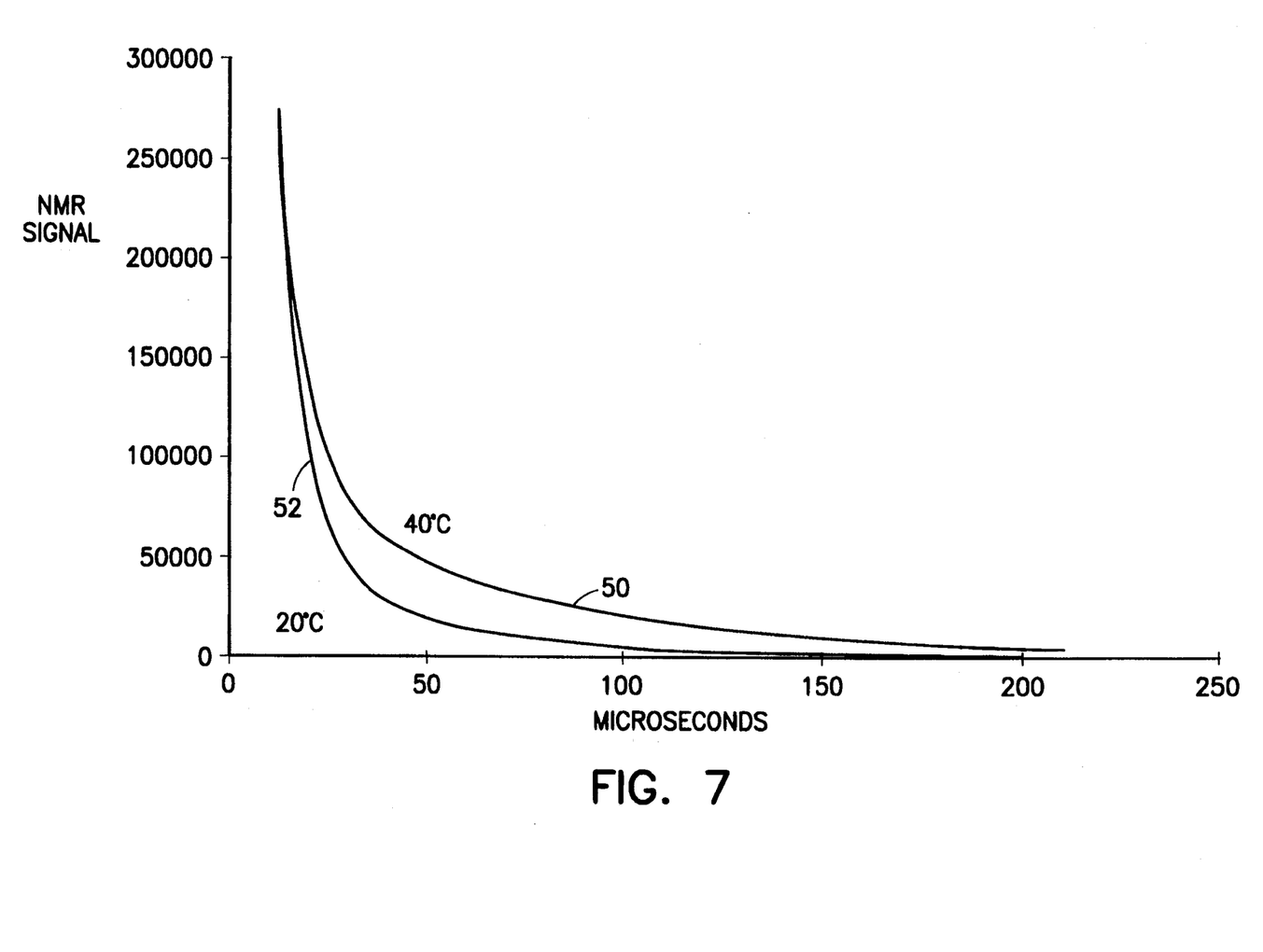
FIG. 7 is a graph showing the effect of temperature on the NMR signal.

As also discussed above, the aforementioned U.S. Pat. Nos. 5,015,954 and 5,049,819 utilize a temperature stabilization system for stabilizing the temperature of the sampling region 18 of the NMR apparatus. Such a temperature stabilization system 49 is shown by a block in FIG. 1. Such a system has a tendency to bring the temperature of the sample to a desired temperature for analysis. This is because the level of the signal output to CPU 24 from coil 22 will vary depending upon the temperature of the sample within sampling region 18. This is shown by the curves 50 and 52 in FIG. 7 for temperatures of 40° C. and 20° C., respectively.

However, in many instances, the temperature of the sample will not change sufficiently fast to bring the sample to the desired temperature. As a result, the FID curve that is obtained will vary depending upon the temperature of the sample when the sample is input into the sampling sleeve 12 of the NMR apparatus 10. Thus, even with a temperature stabilization system in the sampling region, there will still be inaccuracies in the resulting FID curve, due to temperature variations of the sample when the sample is input into the NMR apparatus.

In accordance with another aspect of the present invention, by ensuring that the sample, prior to entering sampling sleeve 12 of apparatus 10, is at the same temperature as that maintained by temperature stabilization system 49 in sampling region 18, there is greater accuracy and uniformity in determination of the characteristics of the sample being tested.

Figure 8:
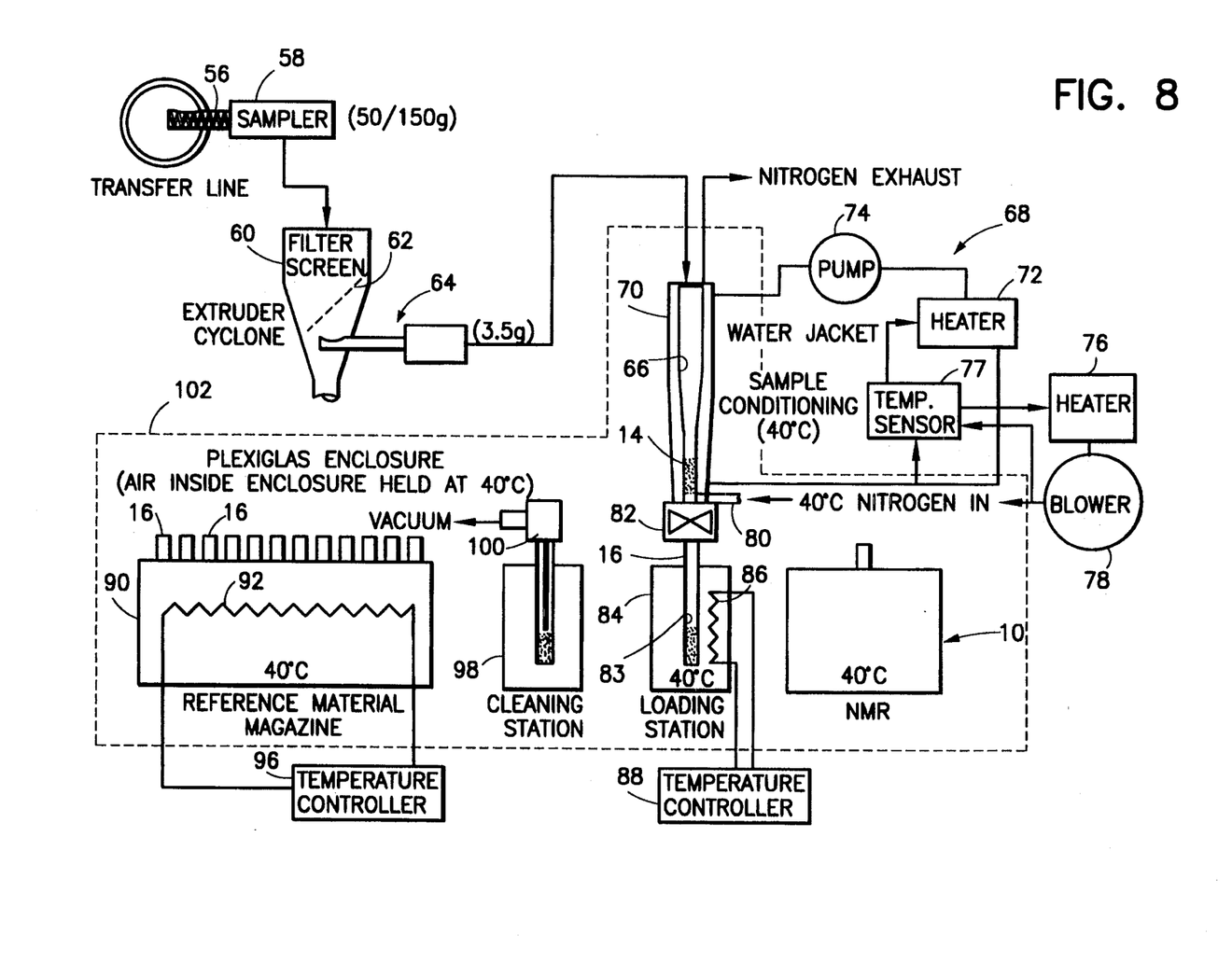
FIG. 8 is a block, schematic diagram of a temperature stabilization assembly which ensures that the sample, prior to entering the sampling sleeve of the apparatus, is at the same temperature as that maintained by the temperature stabilization system in the sampling region.

Thus, referring to FIG. 8, a screw conveyer 56 transfers material to be tested to a sampling device 58, which metes out the material to an extruder cyclone 60, preferably in amounts of 50 grams to 150 grams. Cyclone 60 has a filter screen 62 therein. A transfer device 64 pneumatically transfers smaller amounts of the material, for example, in doses of 3.5 grams, as the sample to be tested, to a sample conditioning chamber 66. A temperature stabilization assembly 68 is associated with sample conditioning chamber 66.

In a preferred embodiment, temperature stabilization assembly 68 includes a water jacket 70 that is connected with a heater 72 and a pump 74 which circulates a heated liquid through water jacket 70 so as to maintain the temperature of the water jacket 70, and thereby, the temperature of sample conditioning chamber 66, at a desired temperature, for example, 40° C. In addition, temperature stabilization assembly 68 includes a heater 76 that heats nitrogen gas or any other suitable gas from a supply (not shown) to the same desired temperature, for example, 40° C., and a blower 78 that forces this heated gas through an inlet 80 at high velocities at the lower end of sample conditioning chamber 66. The spent gas is exhausted through the upper open end of sample conditioning chamber 66. The temperature stabilized gas thereby further acts to bring the temperature of the sample rapidly to the desired temperature. A temperature sensor 77 is provided to sense the temperature of the gas input by blower 78 and the temperature of the liquid in water jacket 70, and to accordingly control heaters 72 and 76.

It will be appreciated that, while use of a water jacket 70 and heating nitrogen has been discussed, any other suitable elements can be used in temperature stabilization assembly 68, such as heated wires embedded in the walls defining sample conditioning chamber 66, fans, or the like.

After a predetermined amount of time which ensures that the sample in sample conditioning chamber 66 is at the desired temperature, a valve 82 at the bottom of sample conditioning chamber 66 is opened, and the sample is deposited in glass test tube 16 which is positioned within an opening 83 in a temperature stabilized block 84 at a loading station. Temperature stabilized block 84 is maintained at the same desired temperature of, for example, 40° C., that is, the same temperature as maintained in sampling region 18, by any suitable means, such as wires 86 embedded within block 84 and controlled electrically by a temperature controller 88.

Then, test tube 16 is removed by a known robot assembly (not shown) to sampling sleeve 12 of apparatus 10 for testing in the manner described above. If it is desired to test the sample at a later time, test tube 16 is placed within a reference material magazine 90, along with other test tubes containing samples. Reference material magazine 90 is also held at the desired temperature by any suitable means, such as wires 92 embedded within magazine 90 and controlled electrically by a temperature controller 96. In addition, a cleaning station 98 can be interposed between temperature stabilized block 84 and reference material magazine 90 in order to suction the sample from test tube 16 and pass the same through a filter 100 before depositing the sample into one of the test tubes in reference material magazine 90.

To further enhance the temperature stabilization, the entire combination of sample conditioning chamber 66, temperature stabilization assembly 68, temperature stabilized block 84, reference material magazine 90, cleaning station 98 and apparatus 10, is held within a plexiglass or similar enclosure 102 that is also maintained at the desired temperature.

Accordingly, the sample is maintained at the same temperature as sampling region 18, before it is supplied to the sampling region. This completely avoids the problem of the prior art in those cases where the temperature of the sample will not change sufficiently fast to bring the sample to the desired temperature. As a result, with the present invention, an accurate FID curve is obtained for the desired temperature setting.

It is to be understood that the above detailed description of a preferred embodiment of the invention is provided by way of example only. Various details of design and construction may be modified without departing from the true spirit and scope of the invention as set forth in the appended claims.

The embodiments of the invention in which an exclusive property or privilege is claimed are defined as follows:

1. A magnetic resonance analyzing apparatus comprising:
a sampling region which holds a sample;
base field applying means for applying a base magnetic field to the sampling region to effect precession of nuclei of said sample;
pulse applying means for:
applying a first excitation pulse having a first phase to the sampling region at a first time, to modify said precession, and
applying a second excitation pulse having a second phase offset from said first phase by 90°, to the sampling region at a subsequent second time corresponding substantially to an end of a first time period during which an output signal emitted from said sample as a result of said first excitation pulse can not be detected, in order to further modify said precession;
detecting means for detecting said output signal emitted from said sample as a result of said first and second excitation pulses; and
analyzing means for:
forming a free induction decay curve from said output signal, starting from a subsequent third time corresponding substantially to an end of a second time period during which an output signal emitted from said sample as a result of said second excitation pulse can not be detected,
separating said free induction decay curve into a Gaussian curve corresponding substantially only to crystallinity content of said sample, an exponential curve corresponding substantially only to amorphous content of said sample, and an intermediate curve corresponding to a combination of said crystallinity and amorphous contents of said sample, and
determining a characteristic of said sample in correspondence with y-axis intercepts of at least one of said Gaussian curve, said exponential curve, said intermediate curve and said free induction decay curve.

2. A magnetic resonance analyzing apparatus according to claim 1, wherein said analyzing means determines said characteristic by determining a ratio of the y-axis intercept of said Gaussian curve to the y-axis intercept of said free induction decay curve.

3. A magnetic resonance analyzing apparatus according to claim 1, wherein said free induction decay curve is defined by the following equation containing first through fourth terms:

$$y = a_0 + a_1 e^{-(\frac{x}{\tau_1 + k})^2} + a_2 e^{-(\frac{x}{\tau_2 + k})} + a_3 e^{-(\frac{x}{\tau_3 + k})^2}$$

wherein the first term is a constant, the second term represents the Gaussian curve corresponding substantially only to crystallinity content of said sample, the third term represents the exponential curve corresponding substantially only to amorphous content of said sample, and the fourth term represents the intermediate curve corresponding to a combination of said crystallinity and amorphous contents of said sample, and wherein k, $a_0$, $a_1$, $a_2$, $a_3$, $\tau_1$, $\tau_2$ and $\tau_3$ are constants.

4. A magnetic resonance analyzing apparatus according to claim 1, wherein said detector means includes amplifier means for amplifying said output signal and envelope detecting means for detecting and separating an envelope signal of said output signal.

5. A magnetic resonance analyzing apparatus according to claim 1, wherein said analyzing means includes a central processing unit.

6. A magnetic resonance analyzing apparatus according to claim 1, wherein said pulse applying means includes a sampling coil surrounding said sampling region, and transmitter means for supplying a modulated oscillation signal to said sampling coil.

7. A magnetic resonance analyzing apparatus according to claim 1, wherein said base field applying means includes a permanent magnet surrounding said sampling region.

8. A magnetic resonance analyzing apparatus according to claim 1, wherein said analyzing means determines a characteristic of said sample in correspondence with a ratio of a sum of the y-intercept of the intermediate curve and one of the following:
(a) the y-intercept of the Gaussian curve, and
(b) the y-intercept of the exponential curve, over the y-intercept of the free induction decay curve.

9. A magnetic resonance analyzing apparatus comprising:
a sampling region which holds a sample;
first temperature stabilization means for maintaining said sampling region at a predetermined temperature;
base field applying means for applying a base magnetic field to the sampling region to effect precession of nuclei of said sample;
pulse applying means for applying at least one excitation pulse to the sampling region to modify said precession;
means for detecting and analyzing a signal emitted from said sample as a result of said at least one excitation pulse; and
second temperature stabilization means for controlling the temperature of said sample to said predetermined temperature prior to said sample entering said sampling region.

10. A magnetic resonance analyzing apparatus according to claim 9, wherein said second temperature stabilization means includes sample conditioning means, external of said sampling region, for holding a sample to be tested by said magnetic resonance analyzing apparatus, and temperature control means for maintaining said sample conditioning means at said predetermined temperature.

11. A magnetic resonance analyzing apparatus according to claim 10, wherein said temperature control means includes a jacket in surrounding relation to said sample conditioning means, and means for circulating a liquid through said jacket at a set temperature in order to maintain said sample at said predetermined temperature in said sample conditioning means.

12. A magnetic resonance analyzing apparatus according to claim 11, wherein said temperature control means further includes temperature adjustment means for controlling the temperature of said liquid.

13. A magnetic resonance analyzing apparatus according to claim 10, wherein said temperature control means includes means for circulating a gas through said sample in said sample conditioning means at a set temperature in order to rapidly change and to maintain said sample at said predetermined temperature in said sample conditioning means.

14. A magnetic resonance analyzing apparatus according to claim 13, wherein said temperature control means further includes temperature adjustment means for controlling the temperature of said gas.

15. A magnetic resonance analyzing apparatus according to claim 10, wherein said second temperature stabilization means includes a temperature stabilized block maintained at said predetermined temperature, and valve means for metering out said sample from said sample conditioning means to said temperature stabilized block.

16. A magnetic resonance analyzing apparatus comprising:
a sampling region which holds a sample;
first temperature stabilization means for maintaining said sampling region at a predetermined temperature;
base field applying means for applying a base magnetic field to the sampling region to effect precession of nuclei of said sample;
pulse applying means for:
applying a first excitation pulse having a first phase to the sampling region at a first time, to modify said precession, and
applying a second excitation pulse having a second phase offset from said first phase by 90°, to the sampling region at a subsequent second time corresponding substantially to an end of a first time period during which an output signal emitted from said sample as a result of said first excitation pulse can not be detected, in order to further modify said precession;
detecting means for detecting said output signal emitted from said sample as a result of said first and second excitation pulses;
analyzing means for:
forming a free induction decay curve from said output signal, starting from a subsequent third time corresponding substantially to an end of a second time period during which an output signal emitted from said sample as a result of said second excitation pulse can not be detected,
separating said free induction decay curve into a Gaussian curve corresponding substantially only to crystallinity content of said sample, an exponential curve corresponding substantially only to amorphous content of said sample, and an intermediate curve corresponding to a combination of said crystallinity and amorphous contents of said sample, and
determining a characteristic of said sample in correspondence with y-axis intercepts of at least one of said Gaussian curve, said exponential curve and said free induction decay curve; and
second temperature stabilization means for controlling the temperature of said sample to said predetermined temperature prior to said sample entering said sampling region.

17. A magnetic resonance analyzing apparatus according to claim 16, wherein said free induction decay curve is defined by the following equation containing first through fourth terms:

$$y = a_0 + a_1 e^{-(\frac{x}{\tau 1 + k})^2} + a_2 e^{-(\frac{x}{\tau 2 + k})} + a_3 e^{-(\frac{x}{\tau 3 + k})^2}$$

wherein the first term is a constant, the second term represents the Gaussian curve corresponding substantially only to crystallinity content of said sample, the third term represents the exponential curve corresponding substantially only to amorphous content of said sample, and the fourth term represents the intermediate curve corresponding to a combination of said crystallinity and amorphous contents of said sample, and wherein k, $a_0$, $a_1$, $a_2$, $a_3$, $\tau_1$, $\tau_2$ and $\Sigma_3$ are constants.

18. A magnetic resonance analyzing apparatus according to claim 16, wherein said second temperature stabilization means includes sample conditioning means, external of said sampling region, for holding a sample to be tested by said magnetic resonance analyzing apparatus, and temperature control means for maintaining said sample conditioning means at said predetermined temperature.

19. A magnetic resonance analyzing apparatus according to claim 18, wherein said temperature control means includes a jacket in surrounding relation to said sample conditioning means, and means for circulating a liquid through said jacket at a set temperature in order to maintain said sample at said predetermined temperature in said sample conditioning means.

20. A magnetic resonance analyzing apparatus according to claim 18, wherein said temperature control means includes means for circulating a gas through said sample in said sample conditioning means at a set temperature in order to rapidly change and to maintain said sample at said predetermined temperature in said sample conditioning means.

21. A method for analyzing a sample using magnetic resonance, said method comprising the steps of:
holding the sample in a sampling region;
applying a base magnetic field to the sampling region to effect precession of nuclei of said sample;
applying a first excitation pulse having a first phase to the sampling region at a first time, to modify said precession;
applying a second excitation pulse having a second phase offset from said first phase by 90°, to the sampling region at a subsequent second time corresponding substantially to an end of a first time period during which an output signal emitted from said sample as a result of said first excitation pulse can not be detected, in order to further modify said precession;
detecting said output signal emitted from said sample as a result of said first and second excitation pulses;
forming a free induction decay curve from said output signal, starting from a subsequent third time corresponding substantially to an end of a second time period during which an output signal emitted from said sample as a result of said second excitation pulse can not be detected;
separating said free induction decay curve into a Gaussian curve corresponding substantially only to crystallinity content of said sample, an exponential curve corresponding substantially only to amorphous content of said sample, and an intermediate curve corresponding to a combination of said crystallinity and amorphous contents of said sample; and
determining a characteristic of said sample in correspondence with y-axis intercepts of at least one of said Gaussian curve, said exponential curve, said intermediate curve and said free induction decay curve.

22. A method according to claim 21, wherein said step of determining said characteristic includes the step of determining a ratio of the y-axis intercept of said Gaussian curve to the y-axis intercept of said free induction decay curve.

23. A method according to claim 21, further including the step of defining said free induction decay curve, prior to said step of separating, by the following equation containing first through fourth terms:

$$y = a_0 + a_1 e^{-(\frac{x}{\tau_1 + k})^2} + a_2 e^{-(\frac{x}{\tau_2 + k})} + a_3 e^{-(\frac{x}{\tau_3 + k})^2}$$

wherein the first term is a constant, the second term represents the Gaussian curve corresponding substantially only to crystallinity content of said sample, the third term represents the exponential curve corresponding substantially only to amorphous content of said sample, and the fourth term represents the intermediate curve corresponding to a combination of said crystallinity and amorphous contents of said sample, and wherein k, $a_0$, $a_1$, $a_2$, $a_3$, $\tau_1$, $\tau_2$ and $\tau_3$ are constants.

24. A method according to claim 21, wherein said step of detecting includes the steps of amplifying said output signal, and detecting and separating an envelope signal of said output signal.

25. A method for analyzing a sample using magnetic resonance, said method comprising the steps of:
holding the sample in a sampling region;
maintaining said sampling region at a predetermined temperature;
applying a base magnetic field to the sampling region to effect precession of nuclei of said sample;
applying at least one excitation pulse to the sampling region to modify said precession;
detecting and analyzing a signal emitted from said sample as a result of said at least one excitation pulse; and
controlling the temperature of said sample to said predetermined temperature prior to said sample entering said sampling region.

26. A method according to claim 25, wherein said step of controlling includes the steps of:
holding the sample to be tested in sample conditioning means, external of said sampling region, and
maintaining said sample conditioning means at said predetermined temperature.

27. A method according to claim 26, wherein said step of maintaining said sample conditioning means includes the steps of:
providing a jacket in surrounding relation to said sample conditioning means, and
circulating a liquid through said jacket at a set temperature in order to maintain said sample at said predetermined temperature in said sample conditioning means.

28. A method according to claim 26 wherein said step of maintaining said sample conditioning means includes the steps of circulating a gas through said sample in said sample conditioning means at a set temperature in order to rapidly change and to maintain said sample at said predetermined temperature in said sample conditioning means.

29. A magnetic resonance analyzing apparatus comprising:
a sampling region which holds a sample;
first temperature stabilization means for maintaining said sampling region at a predetermined temperature;

base field applying means for applying a base magnetic field to the sampling region to effect precession of nuclei of said sample;

pulse applying means for applying at least one excitation pulse to the sampling region to modify said precession;

detecting means for detecting an output signal emitted from said sample as a result of said at least one excitation pulse; and analyzing means for:

forming a free induction decay curve from said output signal, separating said free induction decay curve into a Gaussian curve corresponding substantially only to crystallinity content of said sample, an exponential curve corresponding substantially only to amorphous content of said sample, and an intermediate curve corresponding to a combination of said crystallinity and amorphous contents of said sample, and determining an amount of xylene solubles in said sample in correspondence with a sum of a y-axis intercept of said Gaussian curve and a y-axis intercept of said intermediate curve, over a y-axis intercept of said free induction decay curve.

30. A method for analyzing a sample using magnetic resonance, said method comprising the steps of:

holding the sample in a sampling region;

applying a base magnetic field to the sampling region to effect precession of nuclei of said sample;

applying at least one excitation pulse to the sampling region to modify said precession;

detecting an output signal emitted from said sample as a result of said at least one excitation pulse;

forming a free induction decay curve from said output signal;

separating said free induction decay curve into a Gaussian curve corresponding substantially only to crystallinity content of said sample, an exponential curve corresponding substantially only to amorphous content of said sample, and an intermediate curve corresponding to a combination of said crystallinity and amorphous contents of said sample; and determining an amount of xylene solubles in said sample in correspondence with a sum of a y-axis intercept of said Gaussian curve and a y-axis intercept of said intermediate curve, over a y-axis intercept of said free induction decay curve.

* * * * *